United States Patent
Van Der Avoort et al.

(10) Patent No.: US 11,548,781 B2
(45) Date of Patent: Jan. 10, 2023

(54) ATTACHMENT OF STRESS SENSITIVE INTEGRATED CIRCUIT DIES

(71) Applicant: Sciosense B.V., AE Eindhoven (NL)

(72) Inventors: Casper Van Der Avoort, Waalre (NL); Willem Frederik Adrianus Besling, Eindhoven (NL); Remco Henricus Wilhelmus Pijnenburg, Hoogeloon (NL); Olaf Wunnicke, Eindhoven (NL); Coen Tak, Waalre (NL)

(73) Assignee: SCIOSENSE B.V., AE Eindhoven (NL)

( * ) Notice: Subject to any disclaimer, the term of this patent is extended or adjusted under 35 U.S.C. 154(b) by 241 days.

(21) Appl. No.: 16/759,659

(22) PCT Filed: Nov. 16, 2018

(86) PCT No.: PCT/EP2018/081569
§ 371 (c)(1),
(2) Date: Apr. 27, 2020

(87) PCT Pub. No.: WO2019/096998
PCT Pub. Date: May 23, 2019

(65) Prior Publication Data
US 2020/0361764 A1    Nov. 19, 2020

Related U.S. Application Data

(60) Provisional application No. 62/587,511, filed on Nov. 17, 2017.

(51) Int. Cl.
*B81B 7/00*     (2006.01)
*B81B 7/02*     (2006.01)
(Continued)

(52) U.S. Cl.
CPC .......... *B81B 7/0048* (2013.01); *B81B 7/0074* (2013.01); *B81B 7/02* (2013.01);
(Continued)

(58) Field of Classification Search
CPC ....... B81B 7/0048; B81B 7/0074; B81B 7/02; B81B 2201/0257; B81B 2201/0264;
(Continued)

(56) References Cited

U.S. PATENT DOCUMENTS

| 4,275,406 A | 6/1981 | Mueller et al. |
| 7,768,123 B2 | 8/2010 | Liu et al. |

(Continued)

FOREIGN PATENT DOCUMENTS

| CN | 1460846 A | 12/2003 |
| CN | 101106839 A | 1/2008 |

(Continued)

OTHER PUBLICATIONS

Mu A., "Research on the integration of magnetic field pressure acceleration sensor based on MEMS technology", Heilongjiang University, Apr. 27, 2016, pp. 1-85, 2016, Total pp. 93.

*Primary Examiner* — Nelson Garces
(74) *Attorney, Agent, or Firm* — Slater Matsil, LLP (57) ABSTRACT

A die attachment to a support is disclosed. In an embodiment, a semiconductor package includes a support and a die attached to the support by an adhesive on a backside of the die, wherein the die includes a capacitive pressure sensor integrated on a CMOS read-out circuit, and wherein the adhesive covers only a part of the backside of the die.

8 Claims, 7 Drawing Sheets

(51) Int. Cl.
  *G01L 9/00* (2006.01)
  *H04R 1/04* (2006.01)
  *H04R 19/04* (2006.01)

(52) U.S. Cl.
  CPC .... *G01L 9/0073* (2013.01); *B81B 2201/0257* (2013.01); *B81B 2201/0264* (2013.01); *B81B 2203/0127* (2013.01); *B81B 2207/012* (2013.01); *B81B 2207/015* (2013.01); *H04R 1/04* (2013.01); *H04R 19/04* (2013.01); *H04R 2201/003* (2013.01)

(58) Field of Classification Search
  CPC ...... B81B 2203/0127; B81B 2207/012; B81B 2207/015; G01L 9/0073; G01L 19/0654; G01L 9/0048; H04R 1/04; H04R 19/04; H04R 2201/003
  See application file for complete search history.

(56) References Cited

U.S. PATENT DOCUMENTS

| | | |
|---|---|---|
| 2003/0217603 A1 | 11/2003 | Ishio |
| 2005/0194685 A1 | 9/2005 | Weiblen et al. |
| 2008/0303176 A1 | 12/2008 | Peltz et al. |
| 2010/0224945 A1* | 9/2010 | Takahata ................ G01P 1/023 438/51 |
| 2012/0056280 A1* | 3/2012 | Wu ........................ G01P 15/18 257/E29.324 |
| 2015/0338293 A1 | 11/2015 | Masunishi et al. |
| 2016/0023893 A1 | 1/2016 | Besling et al. |
| 2017/0066646 A1 | 3/2017 | Cheng et al. |
| 2017/0334714 A1* | 11/2017 | Gao ........................ H04R 1/04 |
| 2018/0035548 A1* | 2/2018 | Landesberger ....... H01L 33/483 |

FOREIGN PATENT DOCUMENTS

| | | |
|---|---|---|
| CN | 101493367 A | 7/2009 |
| CN | 101551284 A | 10/2009 |
| CN | 101809733 A | 8/2010 |
| CN | 102162756 A | 8/2011 |
| CN | 103487176 A | 1/2014 |
| CN | 106495086 A | 3/2017 |
| CN | 106794981 A | 5/2017 |
| DE | 2841312 A1 | 4/1980 |
| EP | 2426083 A2 | 3/2012 |
| JP | S58173702 A | 10/1983 |
| TW | 201212174 A | 3/2012 |

* cited by examiner

ATTACHMENT OF STRESS SENSITIVE INTEGRATED CIRCUIT DIES

This patent application is a national phase filing under section 371 of PCT/EP2018/081569, filed Nov. 16, 2018, which claims the priority of U.S. patent No. 62/587,511, filed Nov. 17, 2017, each of which is incorporated herein by reference in its entirety.

TECHNICAL FIELD

The present disclosure relates to the attachment of an integrated circuit die to a carrier.

BACKGROUND

Pressure sensors, such as microelectromechanical systems (MEMS) sensors, have many applications. These sensors can be used, for example, in automotive, consumer, industrial, medical, and other applications. In MEMS sensors, for example, pressure can be measured via deflection of a membrane caused by an external pressure. Large deflections or temperature differences, however, can induce significant non-linearity in the sensors, which may present challenges in a variety of applications. Accurate and repeatable manufacturing processes of membranes and pressure sensors can allow for more accurate pressure readings over a range of temperatures and pressures.

Although some thermal effects and related stresses are predictable and thus can be included in calibrated devices, the overall stress state of the sensor die may be altered by other influences, such as bending of the carrier on which the sensor is mounted and/or moisture uptake leading to non-uniform swell of the carrier. For an ultra-sensitive pressure sensor, such changes often lead to undesirable sensor output drift.

SUMMARY

Embodiments provide packages that can house, for example, a stress sensitive die that needs to be packaged in a low profile package for wearable/consumer/mobile markets and that can benefit from stress decoupling without increasing the build-up height. In general, the package includes a semiconductor die attached to a support by adhesive on a backside of the die. The adhesive covers only part of the backside of the die and can be formed, for example, as stripe-shaped or other non-contiguous regions on the backside of the die.

For example, in one aspect, the present disclosure describes a semiconductor package that includes a support, and a die attached to the support by adhesive on a backside of the die. The die includes a capacitive pressure sensor integrated on a CMOS read-out circuit. The adhesive covers only part of the backside of the die.

Some implementations include one or more of the following features. For example, the adhesive can have multiple non-contiguous regions on the backside of the die. In some instances, the adhesive has two non-contiguous stripe-shaped regions on the backside of the die. The stripe-shaped regions of adhesive can be disposed, for example, adjacent edges of the die. In some cases, e.g., where the capacitive pressure sensor includes a rectangular, suspended tensile membrane, the stripe-shaped regions of adhesive can be oriented parallel to the longer sides of the membrane.

The present disclosure can be particularly advantageous for implementations in which the die has a maximum thickness no greater than 250 μm and/or a packaged product total height no greater than 0.8 mm.

In another aspect, the present disclosure describes a semiconductor package including a support, and a die attached to the support by adhesive on a backside of the die. The adhesive covers only part of the backside of the die and has multiple non-contiguous (e.g., stripe-shaped) regions on the backside of the die.

In yet a further aspect, the present disclosure describes a semiconductor package including a support, and a stack of two or more semiconductor dies. The stack includes an upper die and a lower die. In some cases, the lower die is attached to the support by adhesive on a backside of the lower die such that the adhesive covers only part of the backside of the lower die, and has multiple non-contiguous regions on the backside of the lower die. In some cases, the upper die is attached to the lower die by adhesive on a backside of the upper die such that the adhesive covers only part of the backside of the upper die, and wherein the adhesive has multiple non-contiguous regions on the backside of the upper die.

Some implementations include one or more of the following advantages. In some cases, patterned adhesive improves the package compared to using a solid layer of adhesive. For example, adhesive can act as a roller bearing, preventing bending moments from being transferred to the pressure sensor.

BRIEF DESCRIPTION OF THE DRAWINGS

Other aspects, features and advantages will be readily apparent from the following detailed description, the accompanying drawings and the claims.

FIGS. 4A and 4B illustrate an example of a stack of dies.

FIGS. 5A and 5B illustrate an example of a stack of dies.

DETAILED DESCRIPTION OF ILLUSTRATIVE EMBODIMENTS

Figure 1:
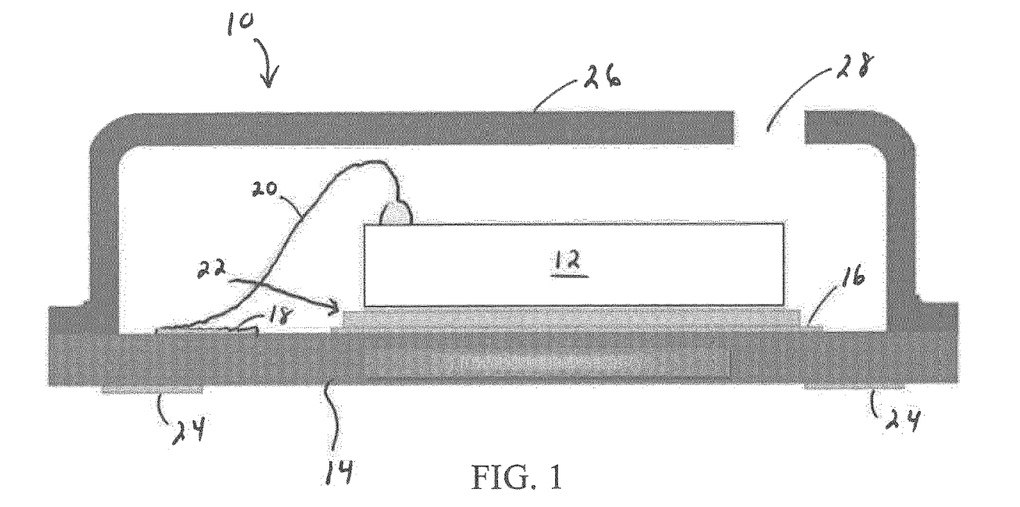
FIG. 1 illustrates an example of a package housing a semiconductor die.

As shown in FIG. 1, a device package 10 includes a die (e.g., semiconductor chip) 12. In the illustrated example, the die 12 includes an application specific integrated circuit (ASIC) with an integrated capacitive pressure (e.g., MEMS) sensor. The package 10 includes a support 14 to which the die 12 is attached. The support 14 can be implemented, for example, as a single or multi-layered (e.g., laminated) substrate, whose surface facing the interior of the package 10 may include a die pad 16 and one or more bond pads 18 for electrical connections 20 to and from the integrated circuit die 12. The die 12 is attached to the support (e.g., the die pad) 16 by an adhesive 22 (e.g., glue) present on only a portion of the backside of the die 12. Thus, in areas the die's backside where no adhesive is present, there is a small gap between the upper surface of the die pad 16 and the backside of the die 12.

The package 10 also includes one or more solder pads 24 on its outer lower surface. The package 10 further includes a metal or other cap 26 that shields the die 12. The cap 26 can have a small opening 28 that provides access to ambient pressure. In some implementations, the cap 26 is fully closed, but the support 14 has a port to provide access to ambient pressure.

In some implementations, the package 10 is relatively thin (e.g., <8 mm) and incorporates a single die 12 that has a thickness no greater than 250 µm. In some cases, the height of the package is less than 0.7 mm.

Figure 2:
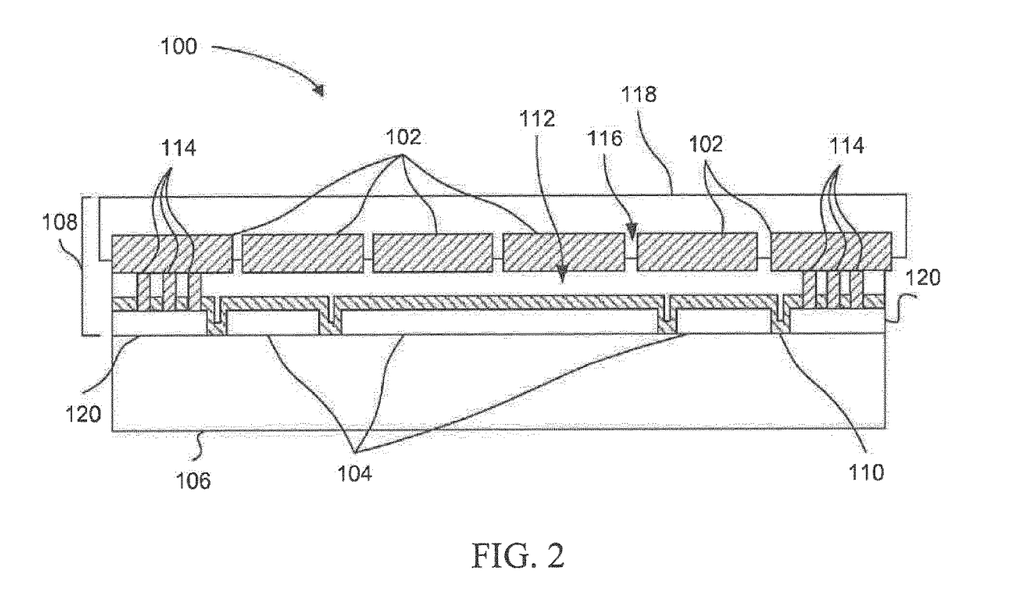
FIG. 2 illustrates an example of a die including capacitive pressure sensor.

FIG. 2 illustrates various details of an example of a capacitive pressure sensor that can be integrated into the die 12. As shown in FIG. 2, a semiconductor device 100 includes a capacitive pressure sensor 108 formed over an integrated circuit 106. The capacitive pressure sensor 108 includes a suspended tensile membrane 102 over a cavity 112. The sensor 108 also includes a bottom electrode 104, which in some implementations is formed on top of the final passivation layer of a CMOS read-out circuit. The electrode(s) and suspended membrane of the capacitive pressure sensor 108 can be connected electrically to the integrated circuit 106. The bottom electrode 104 may be segmented and may include multiple annular rings. Two or more anchor trenches 11 laterally surround the cavity 112, are filled with a first electrically conductive material, and are separated from one another by an oxide support layer (e.g., silicon oxide) 126.

The first electrically conductive material that fills the anchor trenches 114 can include, for example, a PVD Ti/TiN liner and CVD tungsten (W). The cavity 112 sidewalls are formed, at least in part, by the conductive material of the inner anchor trench 114A. The suspended membrane 102 can be composed of a second electrically conductive material (e.g., tungsten (W)) and extends beyond the outer anchor trench 114B. The first electrically conductive material 114 thus serves as supporting anchors for the suspended membrane 102. The first electrically conductive material 114 and the membrane 102 form part of a top electrode that is suspended above the bottom electrode 104. The cavity 112 separates the membrane 102 and bottom electrode 104 from one another. An isolation trench 130 can separate the bottom electrode from connections 120 for the top electrode. The semiconductor device 100 also depicts electrically conductive connections 120 to connect the top electrode or the membrane 102 to the integrated circuit 106 or elsewhere. The semiconductor device 100 also may include aluminum or other contact pads to provide connections to another device. Various vias may extend down from the contact pads to the bottom electrode, and also from the bottom electrode to the CMOS top metal layer.

The foregoing details, illustrated and described in connection with FIG. 2, are simply an example of the type of die 12 that can be attached by adhesive 22 to the die pad 16 in the package 10. Thus, the various inventive concepts described in this disclosure can be used with other integrated circuit dies as well.

Figure 3A:
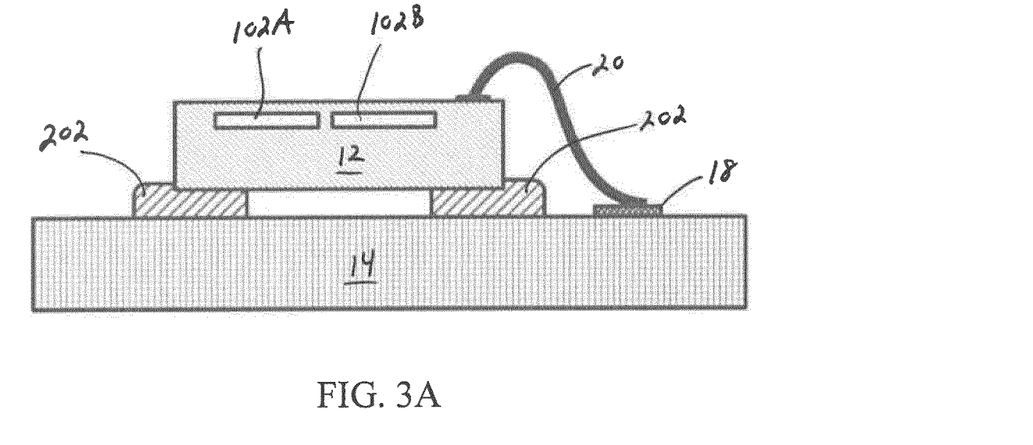
FIG. 3A illustrates a first example of an adhesive pattern.
Figure 3B:
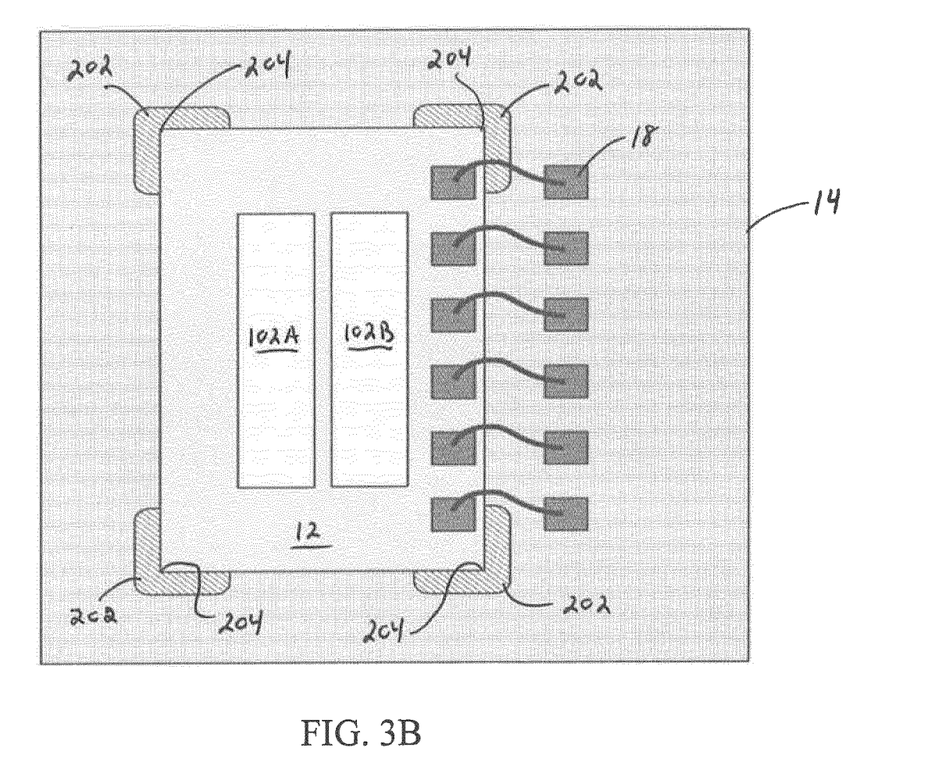
FIG. 3B is a top view of the arrangement of FIG. 3A.

As mentioned above, the die 12 is attached to the die pad 16 by an adhesive 22 present on only a portion of the backside of the die 12. This can be accomplished, for example, by depositing the adhesive 22 in a pattern on selected areas of the backside multiple (e.g., two, three, four or more) areas of the backside of the die 12. For example, as shown in FIGS. 3A and 3B, a small amount of adhesive 202 is provided on the backside of the die 12 at its four corners 204. In some cases, the adhesive dots 202 have a diameter on the order of about 300 µm, 200 µm, or even less. Other areas of the die's backside are not covered with adhesive. Deposition of the adhesive at the corners 204 of the die 12 results in suspension of the die 12 at the corners 204 and can provide a reduction in the transfer of bending moments to the suspended die 12 in two directions. In the example of FIGS. 3A-3B, the integrated pressure sensor includes two membranes 102A, 102B. The number of membranes may differ for other implementations.

In some implementations, the adhesive 22 is provided in the form of dots on multiple (e.g., two, three, four or more) areas of the backside of the die 12. For example, as shown in FIGS. 3A and 3B, a small amount of adhesive 202 is provided on the backside of the die 12 at its four corners 204. In some cases, the adhesive dots 202 have a diameter on the order of about 300 µm, 200 µm, or even less. Other areas of the die's backside are not covered with adhesive. Deposition of the adhesive at the corners 204 of the die 12 results in suspension of the die 12 at the corners 204 and can provide a reduction in the transfer of bending moments to the suspended die 12 in two directions. In the example of FIGS. 3A-3B, the integrated pressure sensor includes two membranes 102A, 102B. The number of membranes may differ for other implementations.

Figure 3C:
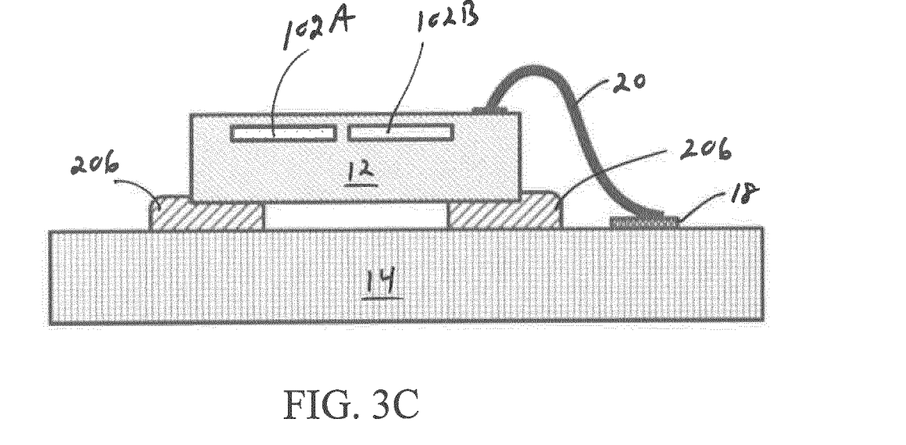
FIG. 3C illustrates a second example of an adhesive pattern.
Figure 3D:
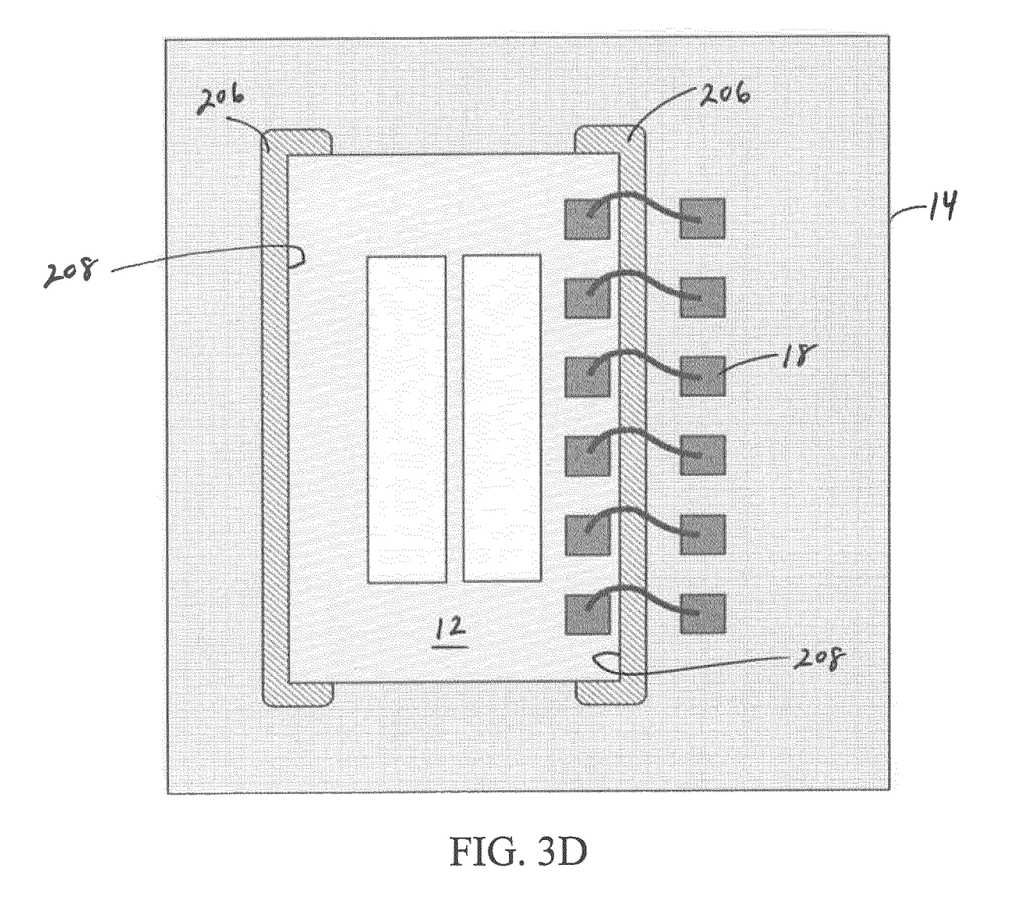
FIG. 3D is a top view of the arrangement of FIG. 3C.

In some implementations, as shown in FIGS. 3C and 3D, the adhesive is provided in the form of multiple stripes 206 on the backside of the die 12. The adhesive stripes 204 can be provided, for example, near edges 208 of the die 12. In some instances, such as for a rectangular-shaped pressure sensor membrane 102, the stripes 204 of adhesive in a particular orientation with respect to the orientation of the membrane 102 on the die 12. For example, in the illustrated example, in which the pressure sensor includes two membranes 102A, 102B, the adhesive stripes 204 are oriented parallel to the longer sides of the rectangular membranes. Such patterning of the adhesive can help reduce the bending moments in at least one direction (i.e., perpendicular to the direction of the adhesive stripes 204). As rectangular membranes generally are more stress sensitive in the direction parallel to the membranes' respective shorter sides, providing the adhesive on the backside of the die 12 in a direction parallel to the membranes' longer sides can be advantageous by helping reduce the stress. The number of adhesive stripes may differ in some implementations. Likewise, adhesive stripes can be used when the pressure sensor includes a different number of membranes.

Various adhesives may be used. In some instances, a flexible adhesive having a Shore Durometer Hardness level (Shore A) below 50 is used. In some cases, it is desirable to use a low-stiffness silicone-based adhesive (e.g., Semicosil® 988/1k adhesive available from Wacker Chemie AG). In some instances, silicone-based glues and B-stage glues with low Young's modulus can be used. Some of the adhesives are heat-curable, and in some cases, are cured at elevated temperatures (e.g., in a temperature range of 100° C.-200° C.) rather than at room temperature. In some instances, the adhesive can be, or include, polydimethylsiloxane (PDMS). For some implementations, the adhesive can be based on acrylate chemistries or a polycarbamin acid derivative. The latter can be advantageous because partial curing can be accomplished by exposure to ultra-violet (UV) radiation, followed by die placement and final thermal curing. Thus, the shape of the adhesive deposits can be retained more easily (i.e., not adversely affected by flow during die placement and curing). Such adhesives are available, for example, from DELO Industrial Adhesives of Germany (e.g., DELO DUALBOND® AD345).

In some implementations, the adhesives can be dispensed easily using any of a wide range of dispensing equipment. The adhesive can be dispensed, for example, from a nozzle. The adhesive can be applied, for example, so as to provide mechanical confinement, e.g., by means of a rim on top of the support 14 or recess in the support. For some implementations (e.g., very small dies), an adhesive should be selected such that the adhesive can be dispensed as small glue droplets with sufficient stand-off height. If the adhesive has too low thixotropy (i.e., shear thinning effect), the adhesive may flow too easily, thereby destroying its desired shape. In some instances, the silicone adhesive can be applied at least two times to increase adhesive height and to avoid adhesive outflow.

By separating the adhesive layer into separate regions, various advantages can be obtained in some implementations. In some cases, the adhesive layer reduces the ability of deformations to be transferred from the substrate 14 to the die 12. Also, an air channel can be provided in the adhesive to allow rapid in and out diffusion of water vapor. The contact areas for the adhesive 22 and the substrate 14 to the ambient are effectively increased, thereby reducing diffusion times for oxygen, water vapor or other gases that might act on the polymers of the adhesive 22 and/or substrate 14. Reduction of these times may reduce delay in temperature-dependent sensor response.

The use of patterned adhesive 22 can result in a packaged sensor in which bending moments originating from mechanical deformation or hygroscopic swelling are eliminated or significantly reduced. Further, the foregoing techniques can be particularly advantageous for thin packages (i.e., <0.8 mm) that incorporate a single die that has a thickness no greater than 250 um. In particular, the techniques described here can improve stress decoupling without increasing the overall build-up height of the package 10.

The techniques described here can, in some instances, provide a low-cost solution that improves the accuracy of a pressure sensor. The techniques can enable accurate usage of the sensor in environments of non-constant relative humidity of the ambient air. Such features can enhance usage of the sensor for applications relating to indoor navigation, such as where one enters an air-conditioned shopping mall from outside where it is humid. Even in such situations, the barometric height as calculated by the pressure sensor should remain stable.

In addition, the techniques described here can enable maintenance of high accuracy even for conditions in which the temperature is non-constant. As is known, due to differences in the coefficient of thermal expansion (CTE), varying temperatures may cause varying levels of board- and package-level stresses. The enhanced level of stress decoupling using patterned adhesive can eliminate or reduce these stresses.

Figure 4A:
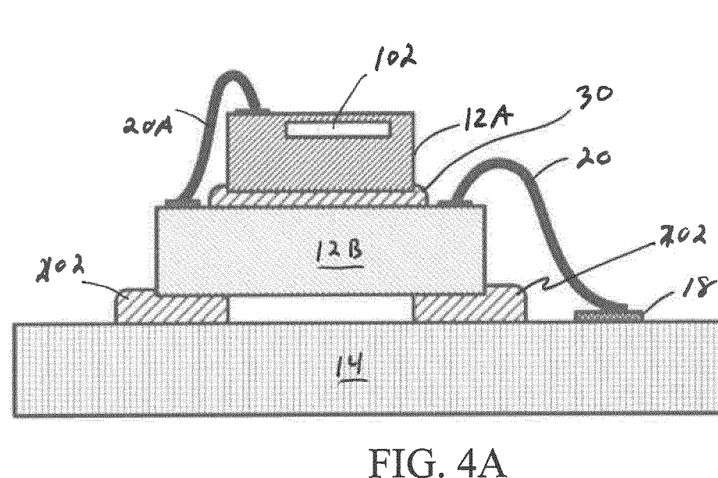
Figure 4B:
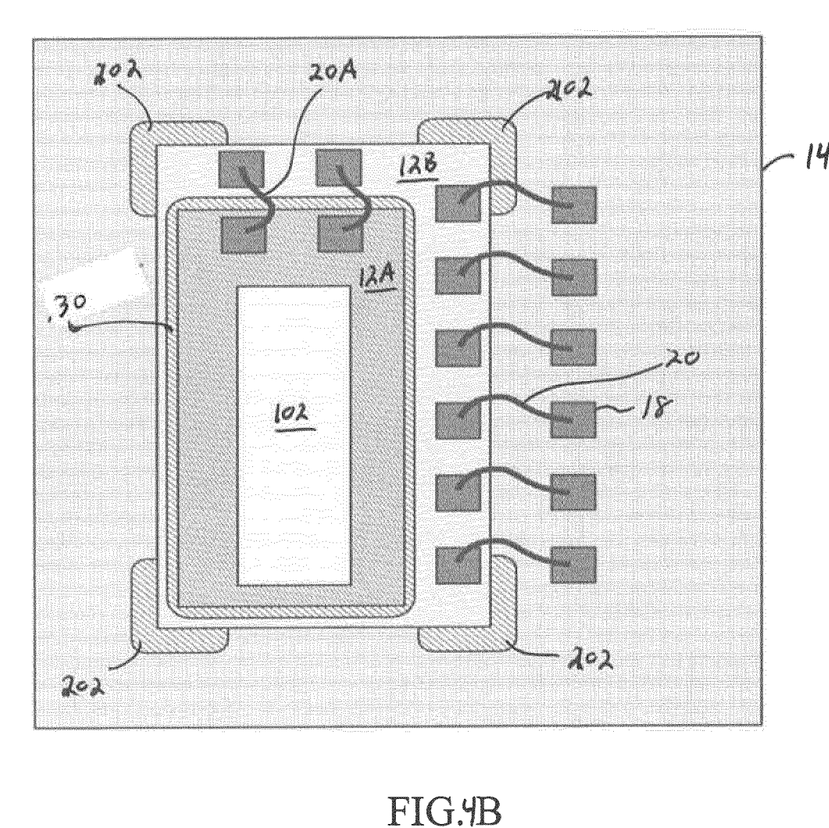
FIG. 4B is a top view of the arrangement of FIG. 4A.

Although the techniques described here can be particularly advantageous for a package housing a single die 12 that includes an ASIC with an integrated capacitive pressure sensor, the techniques also can be used for situations in which the package houses two or more semiconductor dies stacked one atop the other (e.g., a sensor due stacked on a CMOS read-out circuit die). In some cases, as shown in FIGS. 4A and 4B, the lower die (e.g., a CMOS read-out circuit die) 12B is attached, for example, to the die pad of the support 14 using adhesive applied to the backside of the lower die such that the adhesive covers only part of the backside of the lower die 12B (e.g., using adhesive dots 202 at the corner 204 of the die's underside as shown in FIGS. 4A-4B, or using stripes of adhesive). The upper die (e.g., the die including the stress sensitive sensor or transducer) 12A can be attached to the lower die 12B, for example, by a standard die-attach foil 30. Electrical connections 20A can be provided between the upper and lower dies 12A, 12B, for example, using bond wires.

Figure 5A:
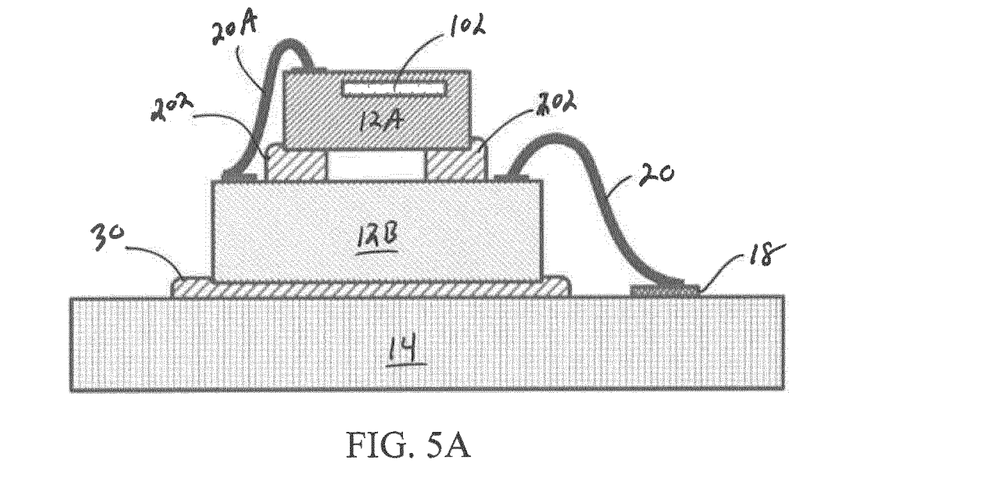
Figure 5B:
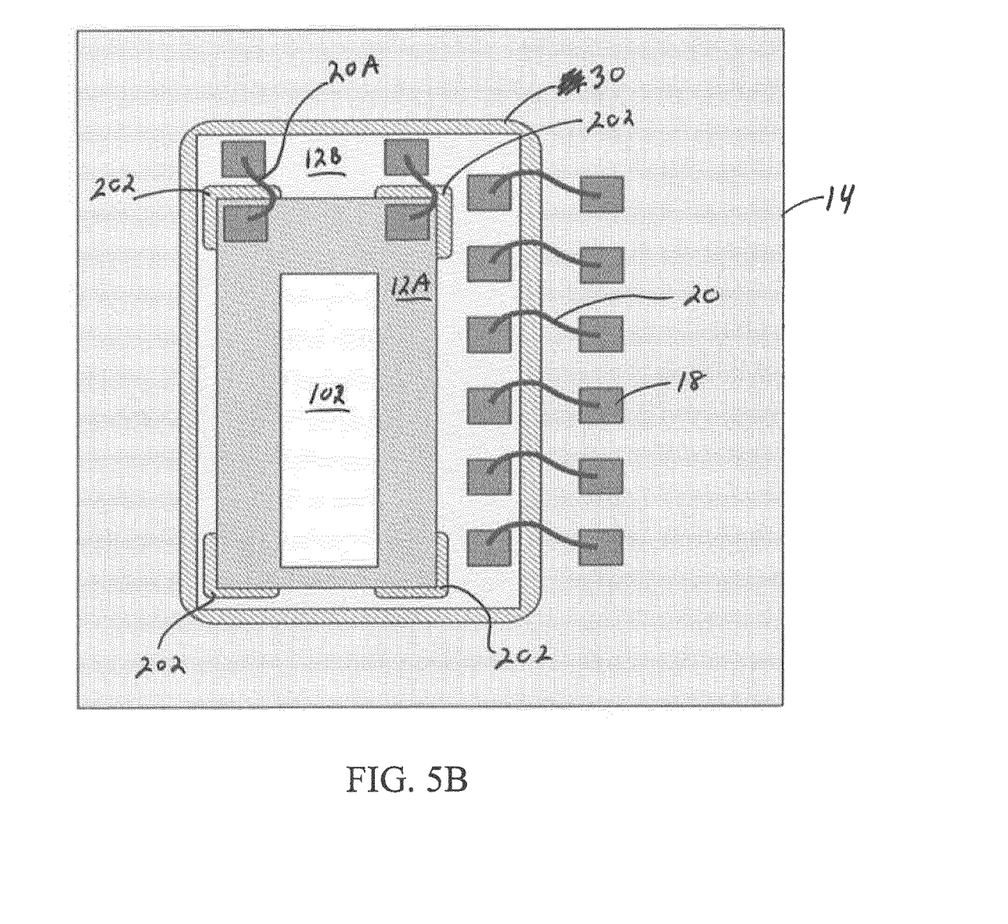
FIG. 5B is a top view of the arrangement of FIG. 5A.
Figure 5C:
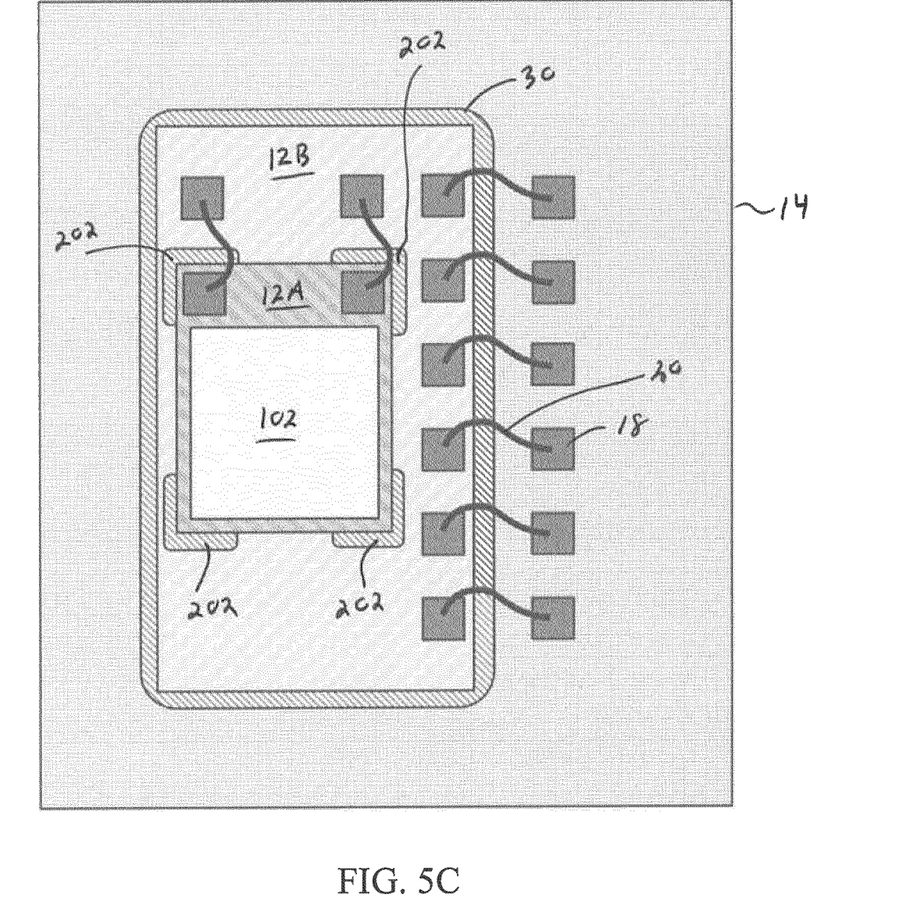
FIG. 5C is a top view for an alternative implementation of FIG. 5A in which the membrane of the capacitive sensor is square shaped.

In some cases, as shown in FIGS. 5A and 5B, the lower or bottom die (e.g., the CMOS read-out circuit die) 12B is attached to the die pad of the support 14 using a standard die-attach foil 30. The upper or top die (e.g., the die including the stress sensitive sensor or transducer) 12A, however, can be attached to the bottom die 12B using adhesive 22 applied to the backside of the top die 12A such that the adhesive covers only part of the backside of the upper die 12A (e.g., using adhesive dots 202 at the corners of the die's underside as shown in FIGS. 5-4B, or using stripes of adhesive). Although the illustrated example of FIG. 5B shows a rectangular membrane 102 having shorter and longer sides, in some cases, the membrane 102 can be square shaped as shown in FIG. 5C. Further, some implementations may include more than one membrane.

Figure 6:
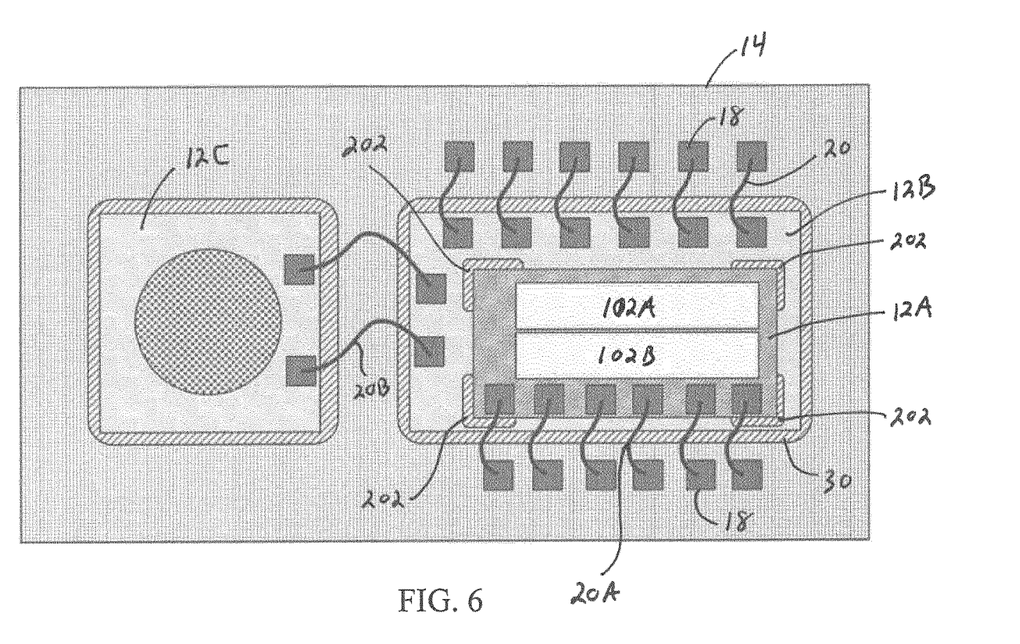
FIG. 6 illustrates an example for a microphone/pressure sensor combination package.

The arrangement of FIGS. 5A-5B can be used, for example, for a microphone/pressure sensor combination package in which the bottom die 12B is an ASIC (e.g., a CMOS read-out circuit) for the microphone, and the top die 12A is an ASIC that includes an integrated pressure sensor including one or more membranes 102A, 102B. FIG. 6 illustrates such an implementation that includes electrical connections 20, 20A from the integrated pressure sensor die 12A and the CMOS read-out circuit die 12B to respective bonding pads 18 on the support 14, and that further includes electrical connections 20B from the CMOS read-out circuit die 12B to a microphone die 12C.

Each of the foregoing implementations discussed in connection with FIGS. 3A-3D, 4A-4B, 5A-5C and 6 can form part of a package that houses the die(s) as shown, for example, in FIG. 1.

Other implementations are within the scope of the claims.

The invention claimed is:

1. A semiconductor package comprising:
a support; and
a die attached to the support by an adhesive on a backside of the die,
wherein the die includes a capacitive pressure sensor integrated on a CMOS read-out circuit,
wherein the adhesive covers only a part of the backside of the die,
wherein the adhesive has two non-contiguous stripe-shaped regions on the backside of the die,
wherein the stripe-shaped regions of the adhesive are disposed adjacent to edges of the die,
wherein the capacitive pressure sensor includes a rectangular, suspended tensile membrane, and
wherein the stripe-shaped regions of the adhesive are oriented parallel to longer sides of the membrane.

2. The package of claim 1, wherein the adhesive has a plurality of non-contiguous regions on the backside of the die.

3. The package of claim 2, wherein the adhesive includes the plurality of non-contiguous regions on the backside of the die at its corners.

4. The package of claim 1, wherein a maximum thickness of the die is not greater than 250 μm.

5. The package of claim 4, wherein a maximum height of the package is not greater than 0.8 mm.

6. The package of claim 1, further comprising an air channel in the adhesive configured to allow out diffusion of water vapor.

7. The package of claim 1, wherein the support includes a die pad, and wherein the die is attached by the adhesive to the die pad.

8. A semiconductor package comprising:
- a support; and
- a die attached to the support by an adhesive on a backside of the die,
- wherein the die includes a capacitive pressure sensor integrated on a CMOS read-out circuit,
- wherein the adhesive covers only a part of the backside of the die,
- wherein the adhesive has a plurality of non-contiguous regions on the backside of the die,
- wherein stripe-shaped regions of the adhesive are disposed adjacent to edges of the die,
- wherein the capacitive pressure sensor includes a rectangular, suspended tensile membrane, and
- wherein the stripe-shaped regions of the adhesive are oriented parallel to longer sides of the membrane.

\* \* \* \* \*

UNITED STATES PATENT AND TRADEMARK OFFICE
CERTIFICATE OF CORRECTION

PATENT NO. : 11,548,781 B2
APPLICATION NO. : 16/759659
DATED : January 10, 2023
INVENTOR(S) : Van Der Avoort et al.

It is certified that error appears in the above-identified patent and that said Letters Patent is hereby corrected as shown below:

On the Title Page

Item (72) Inventors; delete "Coen Tak" and insert --Coenraad Cornelis Tak--.

Signed and Sealed this
Fourth Day of July, 2023

Katherine Kelly Vidal
*Director of the United States Patent and Trademark Office*